(12) United States Patent
Kuriyama

(10) Patent No.: US 11,152,036 B2
(45) Date of Patent: Oct. 19, 2021

(54) ELECTRONIC APPARATUS AND PROTECTIVE COVER

(71) Applicant: SONY CORPORATION, Tokyo (JP)

(72) Inventor: Hideaki Kuriyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 90 days.

(21) Appl. No.: 16/499,913

(22) PCT Filed: Mar. 5, 2018

(86) PCT No.: PCT/JP2018/008250
§ 371 (c)(1),
(2) Date: Oct. 1, 2019

(87) PCT Pub. No.: WO2018/190032
PCT Pub. Date: Oct. 18, 2018

(65) Prior Publication Data
US 2020/0118599 A1    Apr. 16, 2020

(30) Foreign Application Priority Data
Apr. 13, 2017   (JP) .............................. JP2017-079403

(51) Int. Cl.
*G11B 33/02*   (2006.01)
*G06F 1/16*   (2006.01)
(Continued)

(52) U.S. Cl.
CPC .............. *G11B 33/025* (2013.01); *G06F 1/16* (2013.01); *G11B 33/14* (2013.01); *H05K 5/03* (2013.01); *H05K 7/14* (2013.01)

(58) Field of Classification Search
CPC ...... H01R 13/44; H01R 31/06; G11B 33/025; G11B 33/14; G06G 1/16; H05K 5/03; H05K 7/14
(Continued)

(56) References Cited

U.S. PATENT DOCUMENTS 6,334,788 B1   1/2002   Sakaguchi et al.
6,705,890 B2 *  3/2004   Kitou .................... H01R 13/72
                                                    439/160

(Continued)

FOREIGN PATENT DOCUMENTS

EP    2043201    4/2009
JP    S58-069988    5/1983
(Continued)

OTHER PUBLICATIONS

International Search Report prepared by the Japan Patent Office dated May 10, 2018, for International Application No. PCT/JP2018/008250.

*Primary Examiner* — Hae Moon Hyeon
(74) *Attorney, Agent, or Firm* — Sheridan Ross P.C.

(57) ABSTRACT

According to an aspect of the present technology, an electronic apparatus includes: an apparatus main body; a cover main body; and a terminal cover. The apparatus main body includes a connection cable that includes a terminal part on its tip. The cover main body includes an opening part that is capable of storing the terminal part, and the cover main body is affixed to the apparatus main body. The terminal cover includes a fixing part that is fixed to the apparatus main body, and the terminal cover is mounted on the cover main body in a manner that the opening part is openable and closable. When using the electronic apparatus, it is possible to enhance not only impact resistance but also storage property and waterproof property of the connection cable.

20 Claims, 17 Drawing Sheets

(51) Int. Cl.
*G11B 33/14* (2006.01)
*H05K 5/03* (2006.01)
*H05K 7/14* (2006.01)

(58) Field of Classification Search
USPC .................................. 439/131, 135, 502, 501
See application file for complete search history.

(56) References Cited

U.S. PATENT DOCUMENTS

| | | | | |
|---|---|---|---|---|
| 7,104,816 B1 * | 9/2006 | Wang | ..................... | H01R 31/06 |
| | | | | 439/136 |
| 7,578,698 B1 * | 8/2009 | Thia | .................... | H01R 13/5804 |
| | | | | 439/456 |
| 7,909,624 B2 * | 3/2011 | Iida | ....................... | G06F 13/387 |
| | | | | 439/131 |
| 8,749,983 B2 * | 6/2014 | Vandiver | ............... | G06F 1/1632 |
| | | | | 361/728 |
| 8,767,387 B2 * | 7/2014 | Knight | ................... | H01R 13/72 |
| | | | | 361/679.4 |
| 2002/0168891 A1 * | 11/2002 | Kitou | ..................... | H01R 13/72 |
| | | | | 439/501 |
| 2004/0089571 A1 | 5/2004 | Lin | | |
| 2007/0165365 A1 | 7/2007 | Kamiya | | |
| 2008/0227380 A1 | 9/2008 | Hsu et al. | | |
| 2010/0015848 A1 * | 1/2010 | Huang | ................... | H01R 13/72 |
| | | | | 439/501 |
| 2010/0139950 A1 * | 6/2010 | Chen | ..................... | H01R 13/72 |
| | | | | 174/135 |
| 2011/0008980 A1 | 1/2011 | Obata et al. | | |

FOREIGN PATENT DOCUMENTS

| | | |
|---|---|---|
| JP | 2000-148300 | 5/2000 |
| JP | 2000-332428 | 11/2000 |
| JP | 2002-344156 | 11/2002 |
| JP | 2005-228756 | 8/2005 |
| JP | 2007-095112 | 4/2007 |
| JP | 2008-130203 | 6/2008 |
| JP | 2009-021452 | 1/2009 |
| JP | 2011-023091 | 2/2011 |

* cited by examiner

ELECTRONIC APPARATUS AND PROTECTIVE COVER

CROSS REFERENCE TO RELATED APPLICATIONS

This application is a national stage application under 35 U.S.C. 371 and claims the benefit of PCT Application No. PCT/JP2018/008250 having an international filing date of 5 Mar. 2018, which designated the United States, which PCT application claimed the benefit of Japanese Patent Application No. 2017-079403 filed 13 Apr. 2017, the entire disclosures of each of which are incorporated herein by reference.

TECHNICAL FIELD

The present technology relates to a portable electronic apparatus and a protective cover used for the portable electronic apparatus.

BACKGROUND ART

Hard disk drive apparatuses (hereinafter, also referred to as hard disk drives (HDDs)) have been widely used as electronic apparatuses (recording and reproducing apparatuses) that write data and programs and read the recorded data and the like in information processing apparatuses such as personal computers. The HDDs are not limited to HDDs embedded in main bodies of the information processing apparatuses, and portable HDDs and detachable HDDs, which are detachably attached to the main bodies of the information processing apparatuses, have also been developed. Sometimes such an HDD is carried alone, and is kept separately from the main body of the information processing apparatus.

The portable HDD typically includes a metal casing and one or more HDD units stored in the casing. In addition, technologies of affixing a frame-like impact absorber to a periphery surface of a casing to protect HDD units from external force such as impact have been known (see Patent Literature 1 and Patent Literature 2). In addition, HDDs including Universal Serial Bus (USB) cables for connecting with information processing apparatuses have also been known (see Patent Literature 3).

CITATION LIST

Patent Literature

Patent Literature 1: JP 2000-148300A
Patent Literature 2: JP 2007-95112A
Patent Literature 3: JP 2008-130203A

DISCLOSURE OF INVENTION

Technical Problem

It is required for the electronic apparatus including the connection cable such as the USB cable not only to protect the apparatus main body from impact but also to enhance storage property and waterproof property of the connection cable.

In view of the circumstances as described above, a purpose of the present technology is to provide an electronic apparatus and a protective cover that are capable of enhancing not only impact resistance but also storage property and waterproof property of a connection cable.

Solution to Problem

According to an aspect of the present technology, an electronic apparatus includes: an apparatus main body; a cover main body; and a terminal cover. The apparatus main body includes a connection cable that includes a terminal part on its tip. The cover main body includes an opening part that is capable of storing the terminal part, and the cover main body is affixed to the apparatus main body. The terminal cover includes a fixing part that is fixed to the apparatus main body, and the terminal cover is mounted on the cover main body in a manner that the opening part is openable and closable.

When using the electronic apparatus, it is possible to enhance not only impact resistance but also storage property and waterproof property of the connection cable.

The apparatus main body may be a cuboid including a periphery surface part that includes short edge parts and long edge parts, and the terminal cover may be fixed to a portion of the periphery surface part.

This makes it possible to suppress increase in a thickness dimension of the electronic apparatus, and this contributes to reduction in the thickness.

The cover main body may include a first cover part that covers a short edge part of the periphery surface part, and a second cover part that covers a long edge part of the periphery surface part. The opening part may be made in the first cover part, and the second cover part may include a groove part that communicates with the opening part and that is capable of storing the connection cable.

This makes it possible to maintain the appropriate wire length of the connection cable, and stably support the whole connection cable.

The terminal cover may include an engagement protrusion that is engageable with an inner surface of a periphery part of the opening part, an opposing surface that is opposed to an inside of the opening part, and a first engagement groove that is formed on the opposing surface and that is engageable with the connection cable. The opening part may include an abutment surface that is capable of abutting on the opposing surface, and a second engagement groove that is formed on the abutment surface and that communicates with the groove part.

This makes it possible to enhance waterproof property and dust resistance of the terminal part stored in the opening part.

The terminal cover may include a first end part that is fixed to the electronic apparatus, a second end part that is opposite to the first end part, and a first hinge part that is provided between the first end part and the second end part.

This makes it possible to enhance opening/closing operability of the terminal cover.

The terminal cover may further include a storage part. The storage part is provided between the first end part and the first hinge part and is capable of storing the terminal part.

This makes it possible to enhance pullout property of the terminal part from the opening part.

The terminal cover may further include a second hinge part. The second hinge part is provided between the first terminal part and the first hinge part and has larger open torque than open torque of the first hinge part.

This makes it possible to enhance pullout property of the terminal part from the opening part.

The terminal cover may further include a sandwich part that is provided between the terminal part and the first hinge part and that is capable of sandwiching the terminal part.

This makes it possible to enhance pullout property of the terminal part from the opening part.

This makes it possible to enhance pullout property of the terminal part from the opening part.

The cover main body and the terminal cover may typically include an elastic material. This makes it possible to achieve a desired impact resistance.

The cover main body and the terminal cover may include a same elastic material.

According to an aspect of the present technology, a protective cover includes: a cover main body; and a terminal cover.

The cover main body is affixed to an apparatus main body and includes an opening part capable of storing a terminal part of a connection cable fixed to the apparatus main body.

The terminal cover includes a fixing part that is fixed to the apparatus main body, and the terminal cover is mounted on the cover main body in a manner that the opening part is operable and closable.

Advantageous Effects of Invention

As described above, according to the present technology, it is possible to enhance not only impact resistance but also storage property and waterproof property of the connection cable.

Note that, the effects described herein are not necessarily limited and may be any of the effects described in the present disclosure.

MODE(S) FOR CARRYING OUT THE INVENTION

Hereinafter, embodiments of the present technology will be described with reference to the drawings.

First Embodiment

Figure 1:
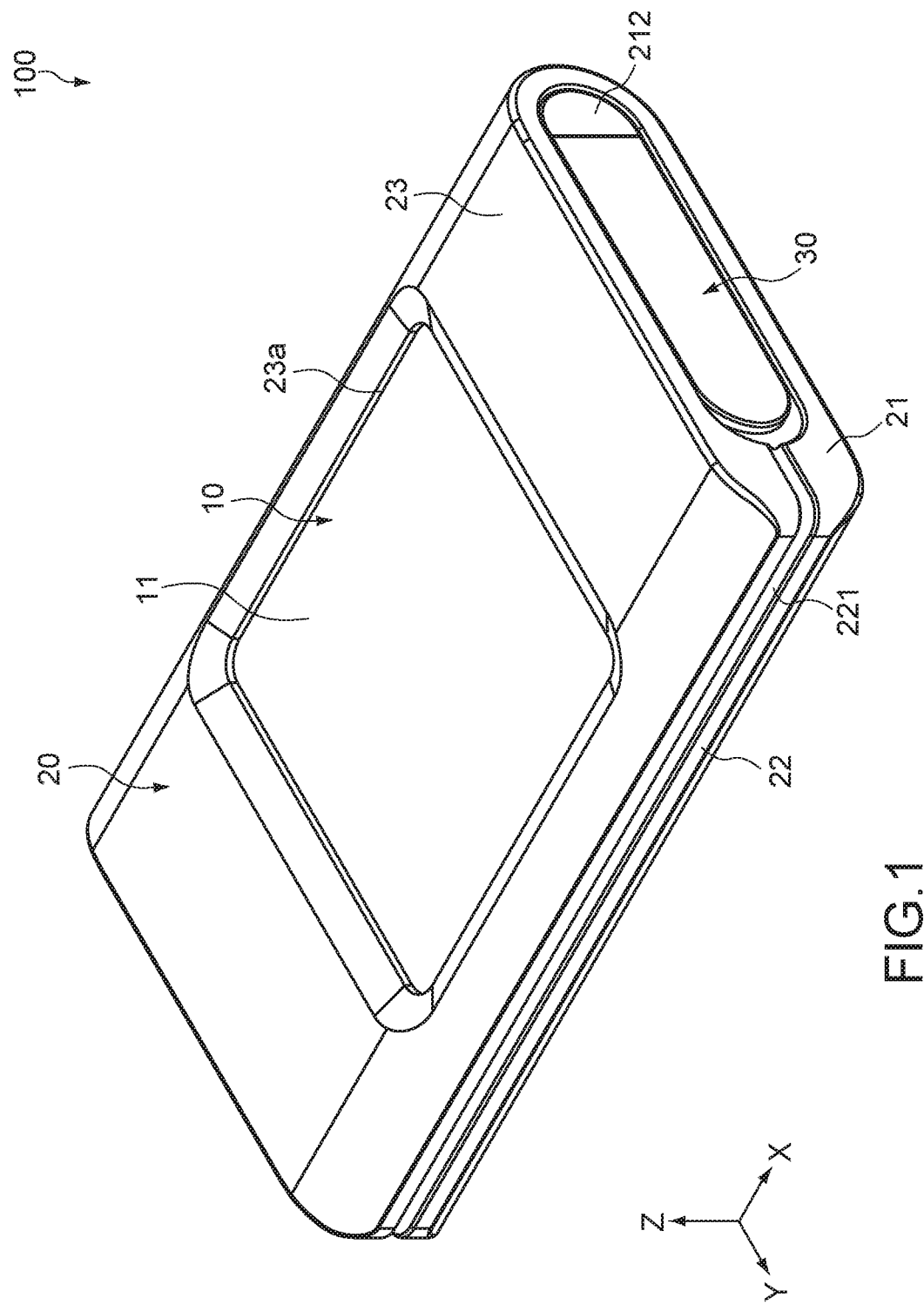
FIG. 1 is a perspective view of an electronic apparatus according to a first embodiment of the present technology.
Figure 2:
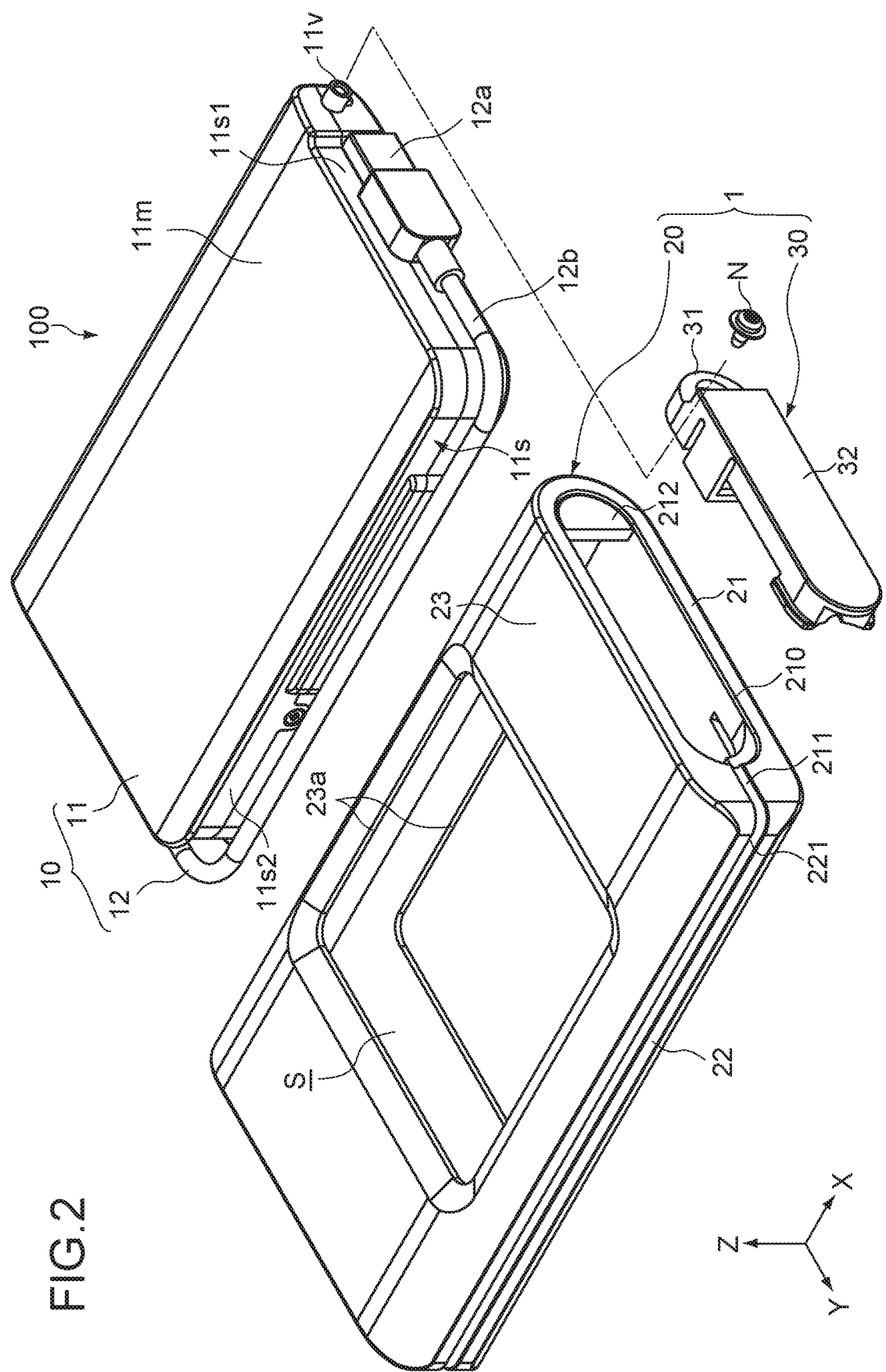
FIG. 2 is an exploded perspective view of main parts of the electronic apparatus.

FIG. 1 is a perspective view of an electronic apparatus according to a first embodiment of the present technology. FIG. 2 is an exploded perspective view of main parts of the electronic apparatus.

Note that, an X axis, a Y axis, and a Z axis in each of the drawings represent three axial directions perpendicular to each other. Here, the X axis represents a front-rear direction (a direction of an arrow represents a front direction), the Y axis represents a width direction, and the Z axis represents a height direction, (the same applies to subsequent drawings).

[Overall Configuration of Electronic Apparatus]

In this embodiment, an electronic apparatus 100 is configured as a portable recording and reproducing apparatus. The electronic apparatus 100 includes an apparatus main body 10 and a protective cover 1 affixed to the apparatus main body 10. The protective cover 1 includes a cover main body 20 and a terminal cover 30.

The size of the electronic apparatus 100 is not specifically limited. In this embodiment, the length along the X axis direction is approximately 170 mm, the width dimension along the Y axis direction is approximately 105 mm, and the thickness (height) dimension along the Z axis direction is approximately 30 mm.

(Apparatus Main Body)

The apparatus main body 10 includes a drive unit 11 and a connection cable 12. The drive unit 11 includes a hard disk drive (HDD) or a solid state drive (SSD) therein. The connection cable 12 has an end connected to the drive unit 11.

The drive unit 11 includes the HDD/SSD and a cuboid casing including the HDD/SSD therein. A material of the casing is not specifically limited. The material of the casing may be metal, synthetic resin, or the like. The drive unit 11 includes a main surface part 11$m$ and a periphery surface part 11$s$. The main surface part 11$m$ has a substantially rectangular planar shape. The periphery surface part 11$s$ has long edges along the X axis direction and short edges along the Y axis direction. An end of the connection cable 12 is connected to the periphery surface part 11$s$ (a short edge part on the rear side in this embodiment) of the drive unit 11.

The connection cable 12 is a communication cable that is electrically connected with an external apparatus such as an information processing apparatus. The connection cable 12 is used for recording data stored in the external apparatus on the drive unit 11, for reading out the data recorded on the drive unit 11 through the external apparatus, and the like. In addition, the connection cable 12 is used as a power supply line for the drive unit 11.

The connection cable 12 includes a terminal part 12a and a cable part 12b. The terminal part 12a is attached to a tip of the cable part 12b. For example, the terminal part 12a includes a connector terminal that meets a USB standard. The cable part 12b includes a flexible wire rod, and includes an insulating resin later that covers wiring and surroundings of the wiring. The length of the cable part 12b is not specifically limited. In this embodiment, the length of the cable part 12b is approximately a half of the length of the perimeter of the drive unit 11. Specifically, the cable part 12b has the length that enables the terminal part 12a to be opposed to a short edge part 11s1 on the front side of the periphery surface part 11s.

(Protective Cover)

The protective cover 1 has a function of an impact buffer for protecting the apparatus main body 10 from external impact, and a function of enhancing waterproof property and dust resistance of the apparatus main body 10.

The cover main body 20 has a space S capable of storing the apparatus main body 10 (drive unit 11), and includes an elastically deformable package that has a substantially cuboid shape. The cover main body 20 includes a material capable of protecting the apparatus main body 10 from drop impact and the like. Typically, the cover main body 20 includes an elastic material such as synthetic rubber. As the elastic material, a silicone-based rubber material with high intensity, heat resistance, and chemical resistance is suitable. However, the elastic material is not limited thereto. It is also possible to use other elastic material such as an acrylic-based elastic material, chloroprene rubber (CR), or the like.

When the cover main body 20 is affixed to the drive unit 11, the cover main body 20 is in close contact with respective parts on the outer surface of the drive unit 11. The cover main body 20 includes a first cover part 21, a second cover part 22, and a third cover part 23.

The first cover part 21 covers the short edge part 11s1 of the periphery surface part 11s of the drive unit 11. The second cover part 22 covers a long edge part 11s2 of the periphery surface part 11s. In addition, the third cover part 23 covers a main surface part 11m of the drive unit 11. A pair of the first cover parts 21, a pair of the second cover parts 22, and a pair of the third cover parts 23 are prepared in a manner that the space S is interposed therebetween, Among the pair of first cover parts 21, the cover part that covers the short edge part list of the front side of the periphery surface part 11s includes an opening part 210, a first groove part 211, and a shielding part 212.

The opening part 210 is configured to be capable of storing the terminal part 12a of the connection cable 12, and has a long hole shape extending in the Y axis direction. The opening part 210 is a recessed part made on the first cover part 21, and includes a predetermined-shaped structure that stores the terminal part 12a therein. Note that, the internal configuration of the opening part 210 will be described later.

The first groove part 211 is configured to be capable of storing the cable part 12b of the connection cable 12. The first groove part 211 is linearly formed on the outer surface of the first cover part 21 along the Y axis direction. One end of the first groove part 211 connects with the opening part 210, and the other end of the first groove part 211 connects with a second groove part 221 (to be described later).

The shielding part 212 is for covering a fixing part 31 of the terminal cover 30. The shielding part 212 is installed across the opening part 210 from the first groove part 211 in the Y axis direction.

One of the pair of second cover parts 22 has the second groove part 221 capable of storing the cable part 12b of the connection cable 12. The second groove part 221 is linearly formed on the outer surface of the second cover part 22 along the X axis direction. One end of the second groove part 221 connects with the first groove part 211.

The first and second groove parts 211 and 221 have the same width and the same depth. The width and depth dimensions of such groove parts 211 and 221 are not specifically limited. In this embodiment, such groove parts 211 and 221 have substantially the same width dimension as the diameter of the cable part 12b, and have a depth dimension larger than the diameter of the cable part 12b. This makes it possible to maintain an appropriate wire length of the connection cable 12, and stably support the connection cable 12.

The pair of the third cover parts 23 each nave a window part 23a. The window part 23a is an opening formed at any position of the cover part 23. The window part 23a has any shape and any size. Through the window part 23a, a portion of the main surface part 11m of the drive unit 11 is exposed to an outside. The window part 23a is for enhancing heat radiation performance of the apparatus main body 10. The position, shape, size, and number of the window parts 23a are not limited to the example illustrated in FIG. 2. In addition, if necessary, sometimes the window parts 23a may be omitted.

The terminal cover 30 is fixed to a portion of the periphery surface part 11s of the drive unit 11. In this embodiment, the terminal cover 30 is fixed to the short edge part 11s1 on the front side. The terminal cover 30 is mounted on the cover main body 20 in a manner that the opening part 210 is openable and closable. The terminal cover 30 includes the fixing part 31 and a flap part 32. The fixing part 31 is fixed to the apparatus main body 10 (drive unit 11). The flap part 32 is openable and closable while using the fixing part 31 as a pivot point.

The terminal cover 30 includes an elastic material. In this embodiment, the terminal cover 30 20 includes the same elastic material (silicone-based resin material) as an elastic material included in the cover main body 20. The color of the terminal cover 30 may be different from the color or the cover main body 20. Since the terminal cover 30 is a different part from the cover main body 20, it is possible to easily prepare them with different colors. This makes it possible to enhance its design and use a combination of colors that matches user preference.

Figure 3:
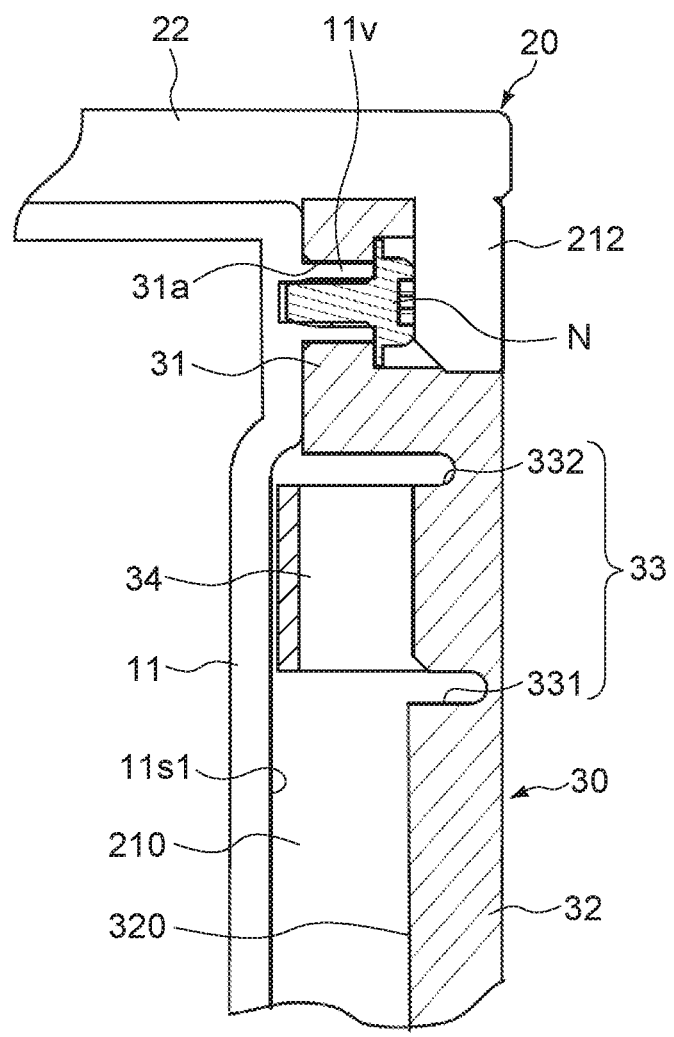
FIG. 3 is a cross-sectional view of core parts of the electronic apparatus.
Figure 4:
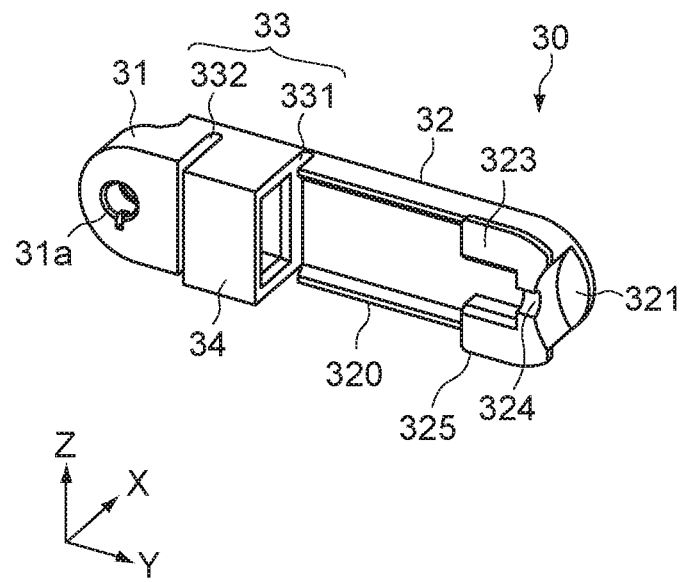
FIG. 4 is a perspective view of a structure of an inner surface side of a terminal cover of the electronic apparatus.
Figure 5:
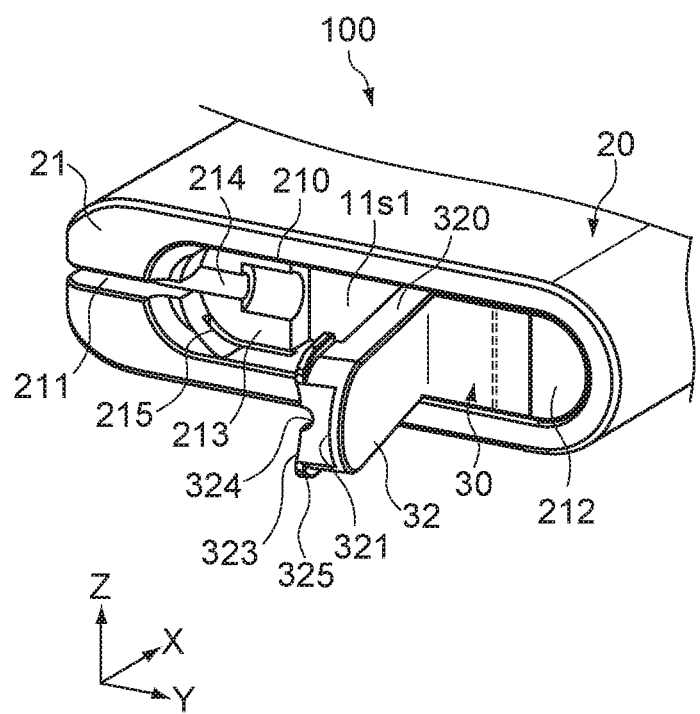
FIG. 5 is a perspective view of core parts of the electronic apparatus in a state in which the terminal cover is open.
Figure 6:
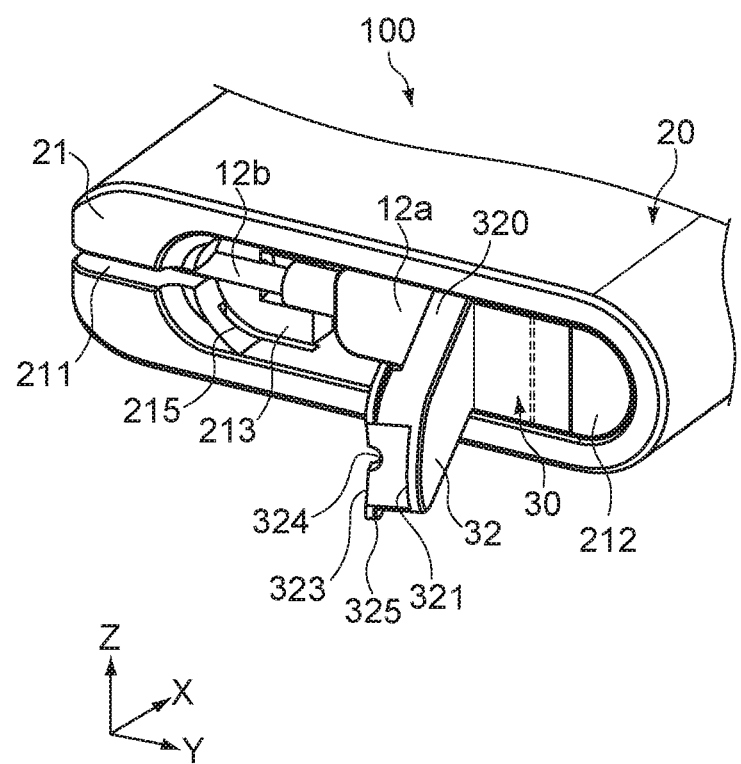
FIG. 6 is a perspective view of core parts in a state in which a connection cable of the electronic apparatus is stored.
Figure 7:
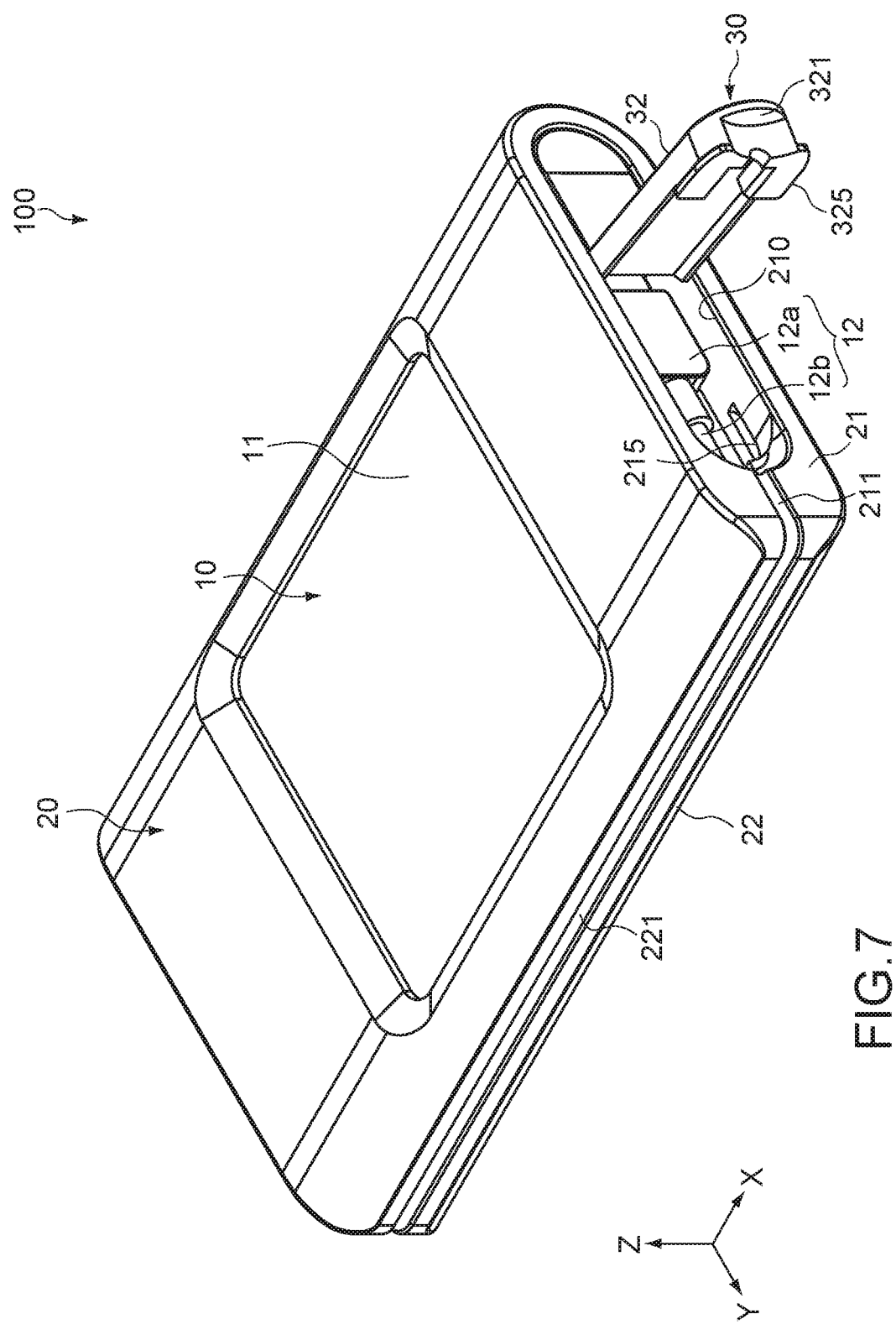
FIG. 7 is a perspective view of core parts in the state in which the connection cable of the electronic apparatus is stored.
Figure 8:
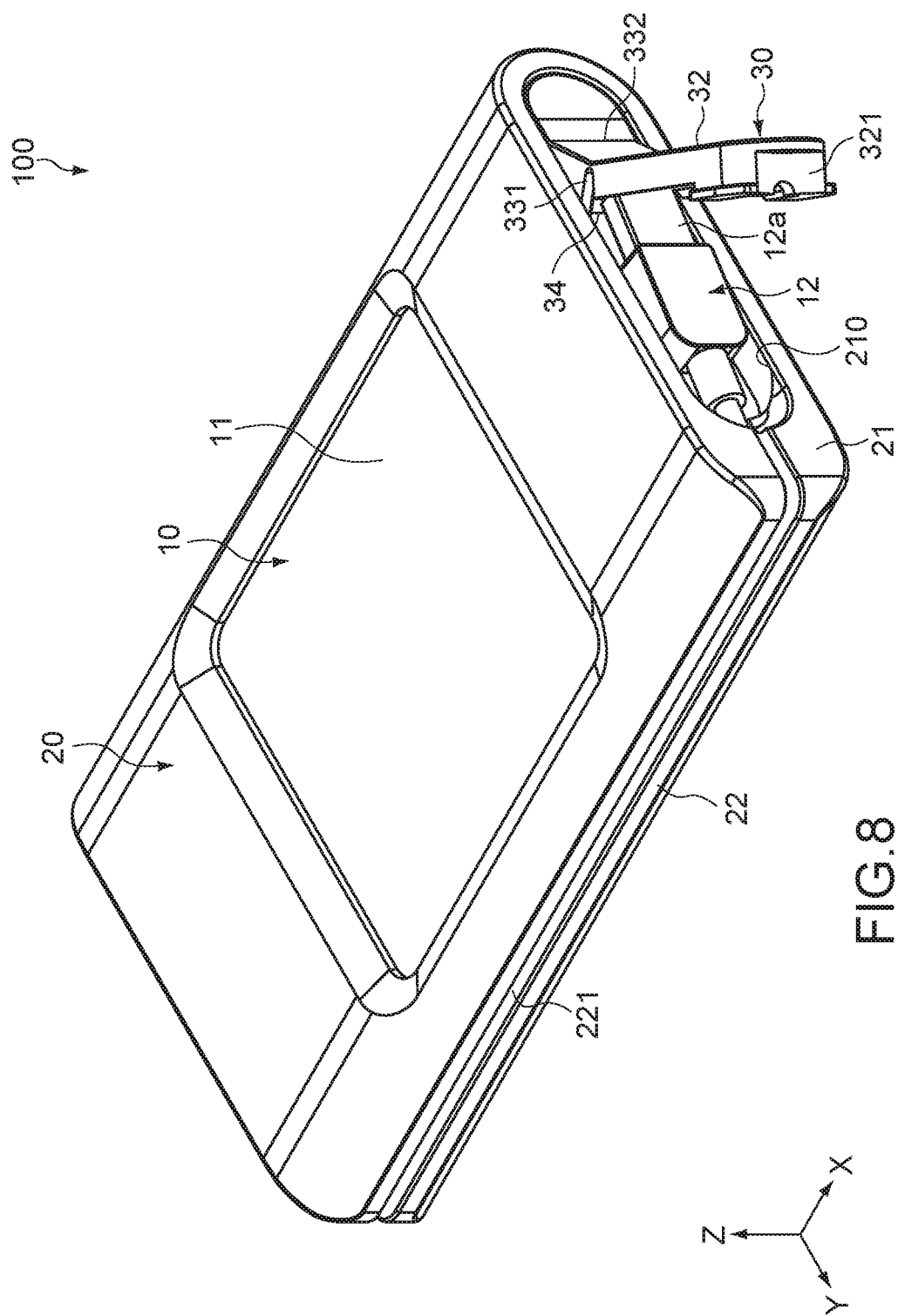
FIG. 8 is a perspective view of core parts of the electronic apparatus for describing how to detach the connection cable.

FIG. 3 is a cross-sectional view of core parts of the electronic apparatus 100. FIG. 3 illustrates the fixing part 31 and structural elements around the fixing part 31. FIG. 4 is a perspective view of a structure of an inner surface side of the terminal cover 30. In addition, FIG. 5 is a perspective view of core parts of the electronic apparatus 100 in a state in which the terminal cover 30 is open. FIG. 6 and FIG. 7 are perspective views of core parts of the electronic apparatus 100 in a state in which the terminal part 12a of the connection cable 12 is stored in the opening part 210.

The terminal cover 30 is a long structure extending in the Y axis direction. The fixing part 31 is provided on one end part (the first end part) in the longitudinal direction. The fixing part 31 has an insertion hole 31a into which a screw N is inserted. By using the screw N, the fixing part 31 is fixed to a boss part 11*v* standing on the short edge part 11*s*1 on the periphery surface part 11*s* of the drive unit 11.

As illustrated in FIG. 3, the thickness of the fixing part 31 is thinner than the flap part 32, and its outer surface is covered with the shielding part 212. The shielding part 212 is formed to have a thickness in a manner that an outer surface of the shielding part 212 is positioned on the same plane or on substantially the same plane as the outer surface of the flap part 32.

The appearance shape of the flap part 32 substantially corresponds to the aperture shape of the opening part 210. As illustrated in FIG. 1 and FIG. 2, the outer surface side of the flap part 32 is flatly formed. As illustrated in FIG. 4, a peripheral wall part 320, an operation part 321, and the like are formed on the inner surface side of the flap part 32.

The peripheral wall part 320 is provided along the periphery of the flap part 32, and is configured to be capable of fitting the inner periphery surface of the opening part 210. The operation part 321 is provided on an end part (the second end part) opposite to the fixing part 31 of the flap part 32, and includes a plate part that protrudes outward from the peripheral wall part 320.

The flap part 32 further includes an opposing surface 323, a first engagement groove 324, and an engagement protrusion 325.

The opposing surface 323 is provided on the end part of the peripheral wall part 320 on the operation part 321 side. The opposing surface 323 is opposed to the abutment surface 213 provided on an inward of the opening part 210 in a manner that the opposing surface 232 is capable of abutting on the abutment surface 213. The opposing surface 323 is configured in a manner that the opposing surface 232 abuts on and closely contacts the abutment surface 213 at a closure position at which the flap part 32 closes the opening part 210.

The first engagement groove 324 is formed on the opposing surface 323, and has a half cylindrical shape that penetrates in the width direction (the Y axis direction). The first engagement groove 324 is configured to be capable of engaging the cable part 12*b* near the terminal part 12*a* of the connection cable 12 stored in the opening part 210.

In a similar way, the abutment surface 213 in the opening part 210 also has a second engagement groove 214 that has a half cylindrical shape and that is opposed to the first engagement groove 324 in the front-rear direction (the axis direction). The second engagement groove 214 is configured to be capable of operating in cooperation with the first engagement groove 324 and sandwiching the cable part 12*b* in the opening part 210. The second engagement groove 214 is formed in a manner that the second engagement groove 214 communicates with the first groove part 211.

The engagement protrusion 325 is configured to protrude from the surroundings of the opposing surface 323 toward the outside of the peripheral wall part 320 in the height direction (the Z axis direction). The flap part 32 is aligned at the closure position at which the flap part 32 closes the opening part 210, when the engagement protrusion 325 engages with an engagement recessed part 215 formed on the periphery of the abutment surface 213 in the opening part 210.

The terminal cover 30 further includes a hinge 33 and a storage part 34.

In this embodiment, the hinge 33 includes a first hinge part 331 and a second hinge part 332.

The first hinge part 331 is provided between the fixing part 31 (the first end part) and the operation part 321 (the second end part). As illustrated in FIG. 3 and FIG. 4, the first hinge part 331 is a groove formed by notching a portion of the peripheral wall part 320 and partially reducing the thickness dimension of the flap part 32 in the X axis direction. This makes it possible to enhance opening/closing operability of the terminal cover 30, and to cause the terminal cover 30 to elastically return to the closure position at which the opening part 210 is closed.

The second hinge part 332 is provided between the fixing part 31 and the first hinge part 331. The second hinge part 332 is configured to have larger open torque than the first hinge part 331.

In a way similar to the first hinge part 331, the second hinge part 332 is formed by partially reducing the thickness dimension of the flap part 32. In this embodiment, the second hinge part 332 is configured in a manner that a portion of the flap part 32 at which the second hinge part 332 is formed has a larger thickness dimension than a portion of the flap part 32 at which the first hinge part 331 is formed.

Therefore, the hinge 33 is configured in a manner that the first hinge part 331 is preferentially bent (rotated) in comparison with the second hinge part 332 when the operation part 321 is pinched and the flap part 32 is released from the closure position (see FIG. 5 and FIG. 6). In addition, since the hinge parts 331 and 332 are provided on the inner surface side of the terminal cover 30, it is difficult to visually recognize the hinge parts 331 and 332 from the outer surface side of the terminal cover 30, and the design of the terminal cover 30 is improved.

The storage part 34 is configured to be capable of storing a portion of the terminal part 12*a* of the connection cable 12 stored in the opening part 210. The storage part 34 is provided between the fixing part 31 and the first hinge part 331. In particular, in this embodiment, the storage part 34 is provided between the first hinge part 331 and the second hinge part 332. As illustrated in FIG. 3 and FIG. 4, the storage part 34 is formed in a manner that the storage part 34 has a cuboid-tubular shape including a storage space that penetrates in the width direction (the Y axis direction).

Note that, although not illustrated, a pullout window for pulling out the connection cable 12 from the drive unit 1 is provided on a cover part that covers a short edge part on the rear side of the periphery surface part 11*s* among the first cover parts 21. The pullout window communicates with the other end part of the second groove part 221. Note that, it is also possible to provide another cover member for opening/closing the pullout window, and the cover member may be configured in a way similar to the terminal cover 30.

[Working of First Embodiment]

Next, workings of the electronic apparatus 100 configured as described above according to this embodiment will be described.

When the electronic apparatus 100 is not used, the terminal part 12*a* of the connection cable 12 is stored in the opening part 210 of the cover main body 20, the cable part 12*b* of the connection cable 12 is stored in the first and second groove parts 211 and 221 of the cover main body 20, and the opening part 210 is closed by the terminal cover 30 (see FIG. 1). This makes it possible to compactly store the connection cable 12 without spreading out the connection cable 12 to the outside of the protective cover 1. Therefore, portability of the electronic apparatus 100 is enhanced and it is possible to protect the connection cable 12.

In this state, the engagement, protrusion 325 of the terminal cover 30 engages with the engagement recessed part 215 in the opening part 210, and this makes it possible to lock the terminal cover 30 to the opening part 210, and it is possible to prevent the terminal cover 30 from being unintentionally opened.

In addition, at the closure position of the terminal cover 30, working of abutment between the peripheral wall part 320 and the inner periphery surface of the opening part 210 and working of close contact between the opposing surface 323 and the abutment surface 213 make it possible to prevent water and dust from entering the inside of the opening part 310 from the outside of the terminal cover 30.

In addition, working of sandwich of the cable part 12b between the first engagement groove 324 on the opposing surface 323 and the second engagement groove 214 on the abutment surface 213 makes it possible to prevent water from entering the opening part 210 through the first and second groove parts 211 and 221.

In addition, since the protective cover 1 includes an elastic material, it is possible to ease drop impact and the like of the electronic apparatus 100 and try to protect the apparatus main body 10.

As described above, it is possible to ensure impact resistance of the electronic apparatus 100, and storage property, waterproof property, and dust resistance of the connection cable.

Next, a way to attach/detach the connection cable 12 to/from the protective cover 1 will be described.

FIG. 7 to FIG. 10 are perspective views of core parts of the electronic apparatus 100 for describing how to detach the connection cable 12.

When the electronic apparatus 100 is to be used, the connection cable 12 is detached from the protective cover 1. In this case, as illustrated in FIG. 7, the terminal cover 30 is first pivotally moved to the open position and the opening part 210 is opened.

When pivotally moving the terminal cover 30, the operation part 321 is held by a finger or the like of a user and pulled out toward the outside, and working of locking based on engagement between the engagement protrusion 325 of the terminal cover 30 and the engagement recessed part 215 in the opening part 210 is canceled. At this time, it is possible to easily pull out the operation part 321 by elastically pressing a portion of the cover main body 20 (the first cover part 21) near the operation part 321.

In addition, when pivotally moving the terminal cover 30, the first hinge part 331 that has a smaller open torque among the hinge 33 is preferentially bent (see FIG. 7). Through the operation of further opening the terminal cover 30, the second hinge part 332 starts bending (see FIG. 8). Since the second hinge part 332 is bent, the storage part 34 of the terminal cover 30 moves forward at the same time. Accordingly, the terminal part 12a of the connection cable 12 that has been partially stored in the storage part 34 is pulled out from the opening part 210 (see FIG. 8). This makes it possible to easily pull out the terminal part 12a from the opening part 210 (see FIG. 9).

Figure 9:
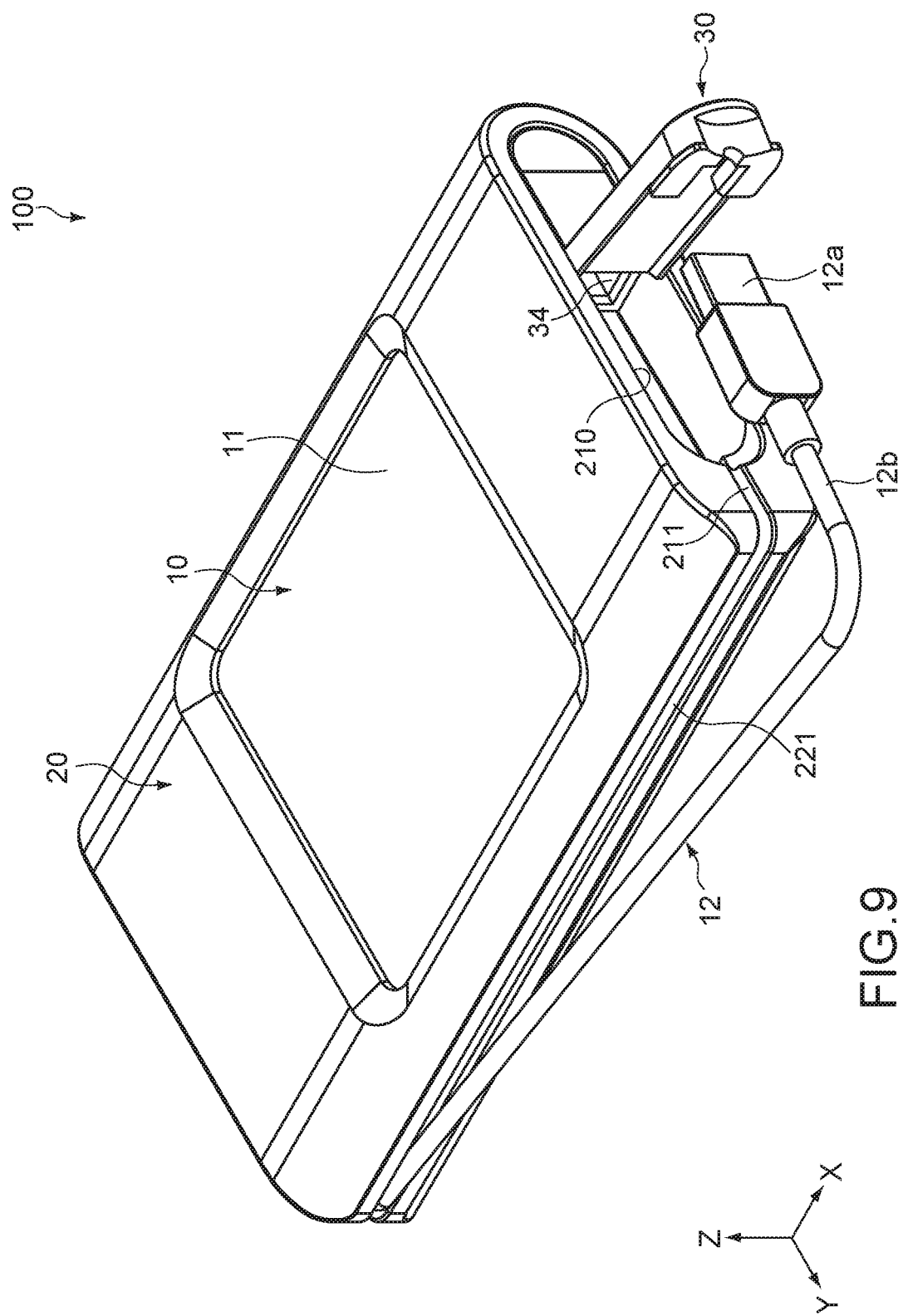
FIG. 9 is a perspective view of core parts of the electronic apparatus for describing how to detach the connection cable.
Figure 10:
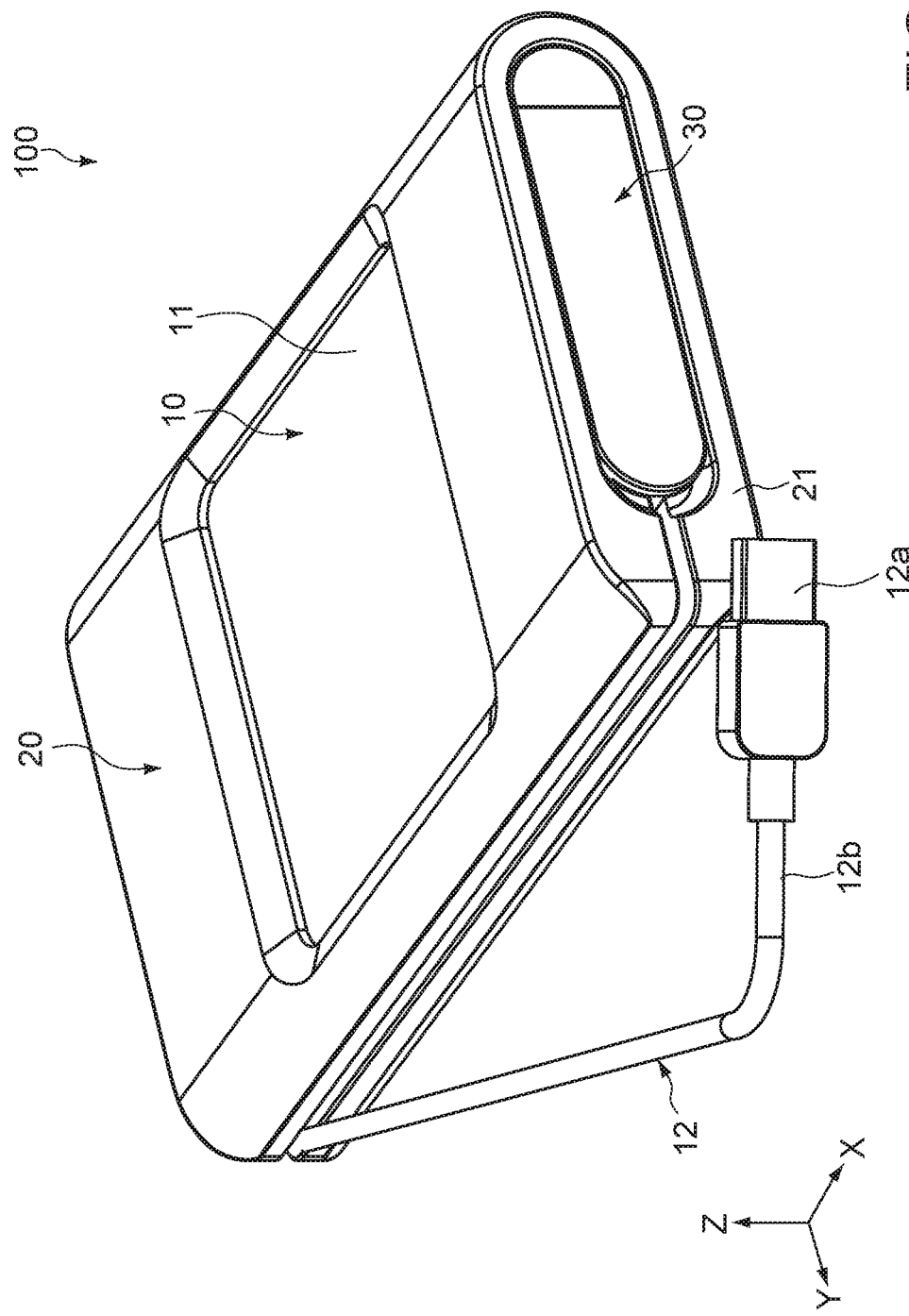
FIG. 10 is a perspective view of core parts of the electronic apparatus for describing how to detach the connection cable.

Subsequently, the cable part 12b of the connection cable 12 is pulled out from the first and second groove parts 211 and 221, and the connection cable 12 is detached from the protective cover 1 accordingly (see FIG. 9 and FIG. 10).

When storing the connection cable 12 in the protective cover 1, reverse procedure to the above described operations is typically carried out. At this time, it is possible to store the terminal part 12a in the opening part 210, and then store the cable part 12b in the groove parts 211 and 221. Alternatively, it is also possible to store the cable part 12b in the groove parts 211 and 221, and then store the terminal part 12a in the opening part 210.

In this embodiment, the terminal cover 30 is fixed to the apparatus main body 10 (the drive unit 11). Therefore, the terminal cover 30 never separates from the apparatus main body 10 even after the connection cable 12 is pulled out. Accordingly, custody of the terminal cover 30 is not necessary because separation and loss of the terminal cover 30 are prevented this time, the terminal cover 30 may be locked at the closure position at which the opening part 210 is closed as illustrated in FIG. 10.

Second Embodiment

Figure 11:
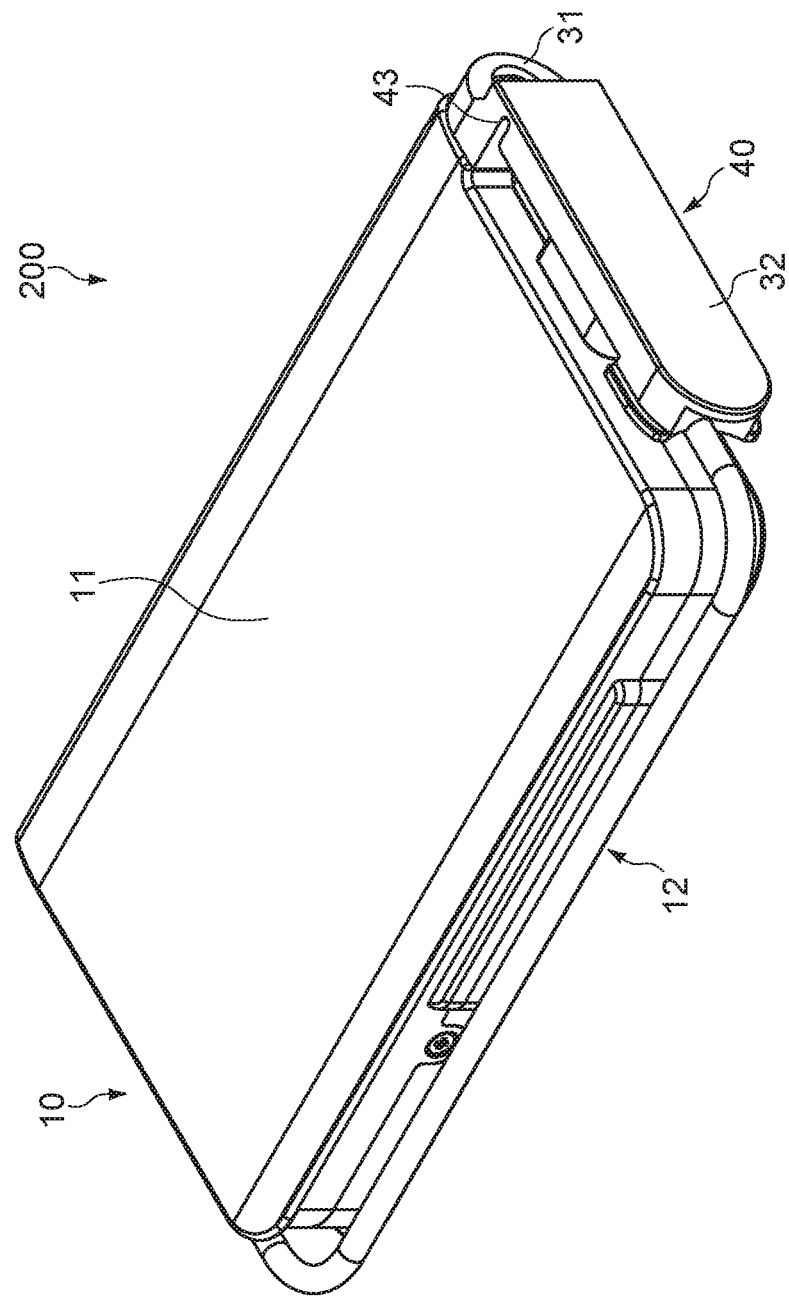
FIG. 11 is a perspective view of an electronic apparatus according to a second embodiment of the present technology in a state in which a cover main body is detached.
Figure 12:
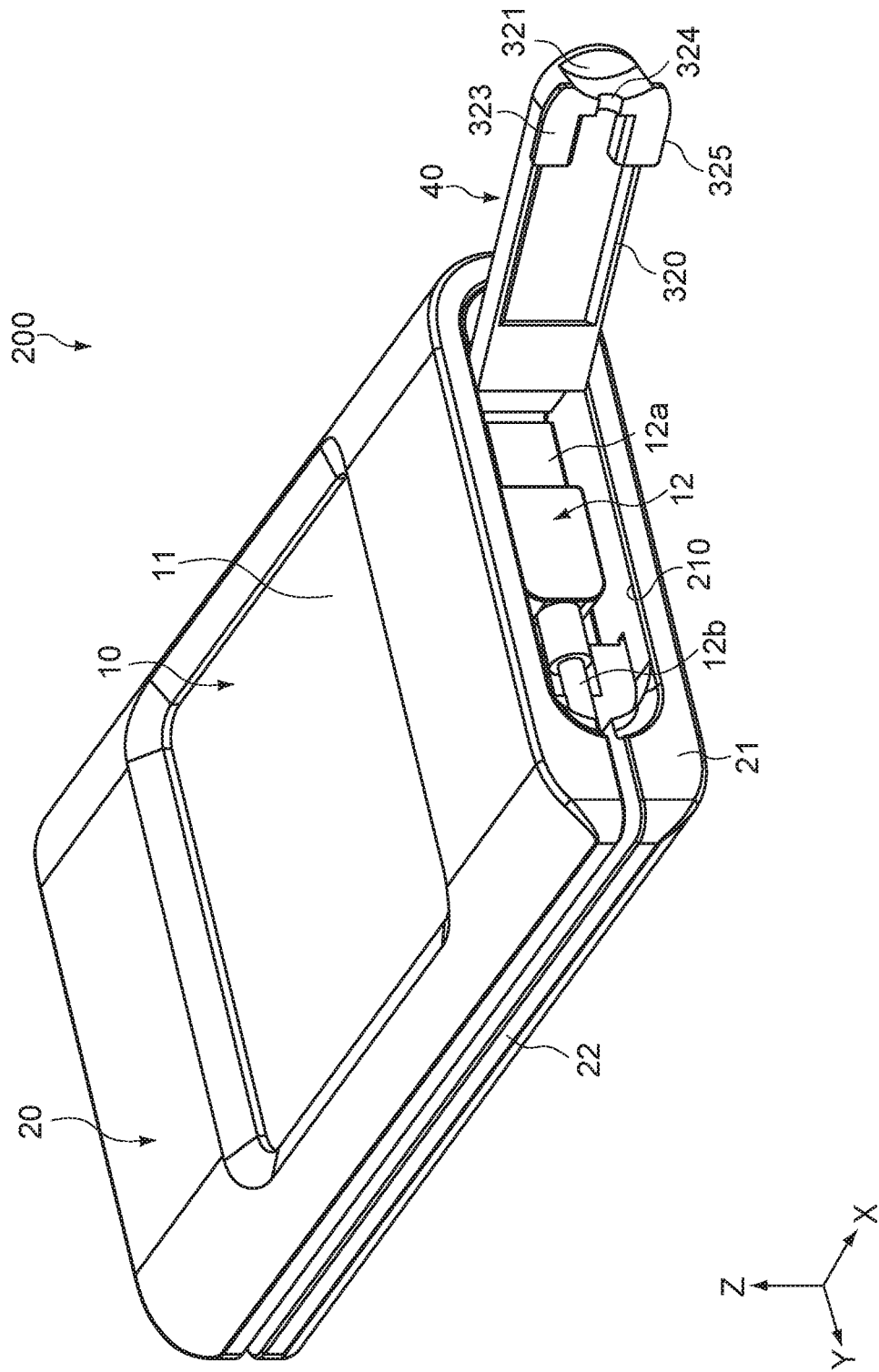
FIG. 12 is a perspective view of core parts in a state in which a terminal cover of the electronic apparatus is open.
Figure 13:
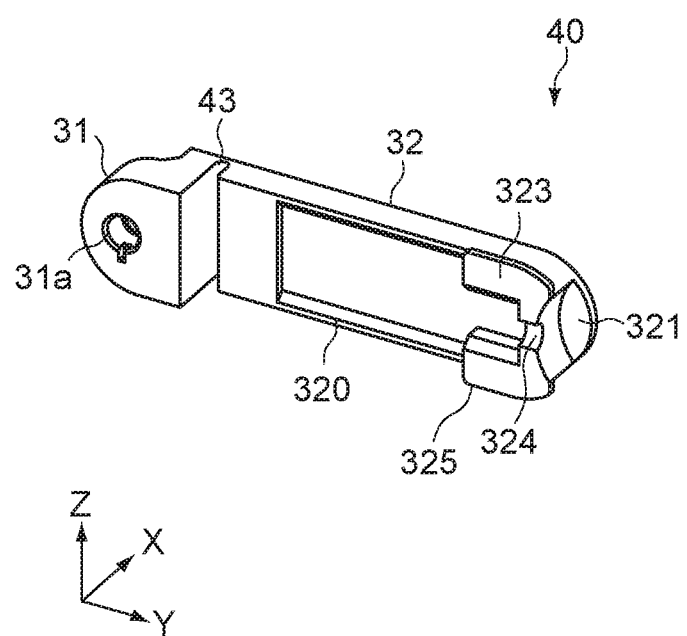
FIG. 13 is a perspective view of the terminal cover.

FIG. 11 to FIG. 13 illustrate a second embodiment of the present technology. FIG. 11 is a perspective view of an electronic apparatus in a state in which a cover main body is detached. FIG. 12 is a perspective view of core parts of the electronic apparatus in a state in which a terminal cover is open. FIG. 13 is a perspective view of the terminal cover.

Hereinafter, structures different from those in the first embodiment will be mainly described. The structures that are similar to those in the first embodiment will be denoted by the same reference signs as the first embodiment, and description thereof will be omitted or simplified.

An electronic apparatus 200 according to this embodiment includes the apparatus main body 10, the cover main body 20, and a terminal cover 40 that is differently configured from the first embodiment.

In other words, the terminal cover 40 of this embodiment is similar to the first embodiment in that the terminal cover 40 includes the fixing part 31 and the flap part 32, the operation part 321, the opposing surface 323, the first engagement groove 324, and the engagement protrusion 325 are provided on the peripheral wall part 320 of the flap part 32. However, the terminal cover 40 is different from the first embodiment in that the terminal cover 40 does not include the storage part 34 and a hinge 43 includes only one hinge part. The hinge 43 is provided at a position corresponding to the position at which the second hinge part 332 is formed according to the first embodiment. However, the position of the hinge 43 is not limited thereto, and the hinge 43 may be provided at any position.

The electronic apparatus 200 configured as described above according to this embodiment can achieve working effects similar to the first embodiment described above. In the second embodiment, it is possible to open the opening part 210 with a large opening area through a single action when performing the operation of opening the terminal cover 40. Therefore, it is possible to ensure a good pullout property of the terminal part 12a of the connection cable 12 from the opening part 210, and a good storage property in the opening part 210.

Third Embodiment

Figure 14:
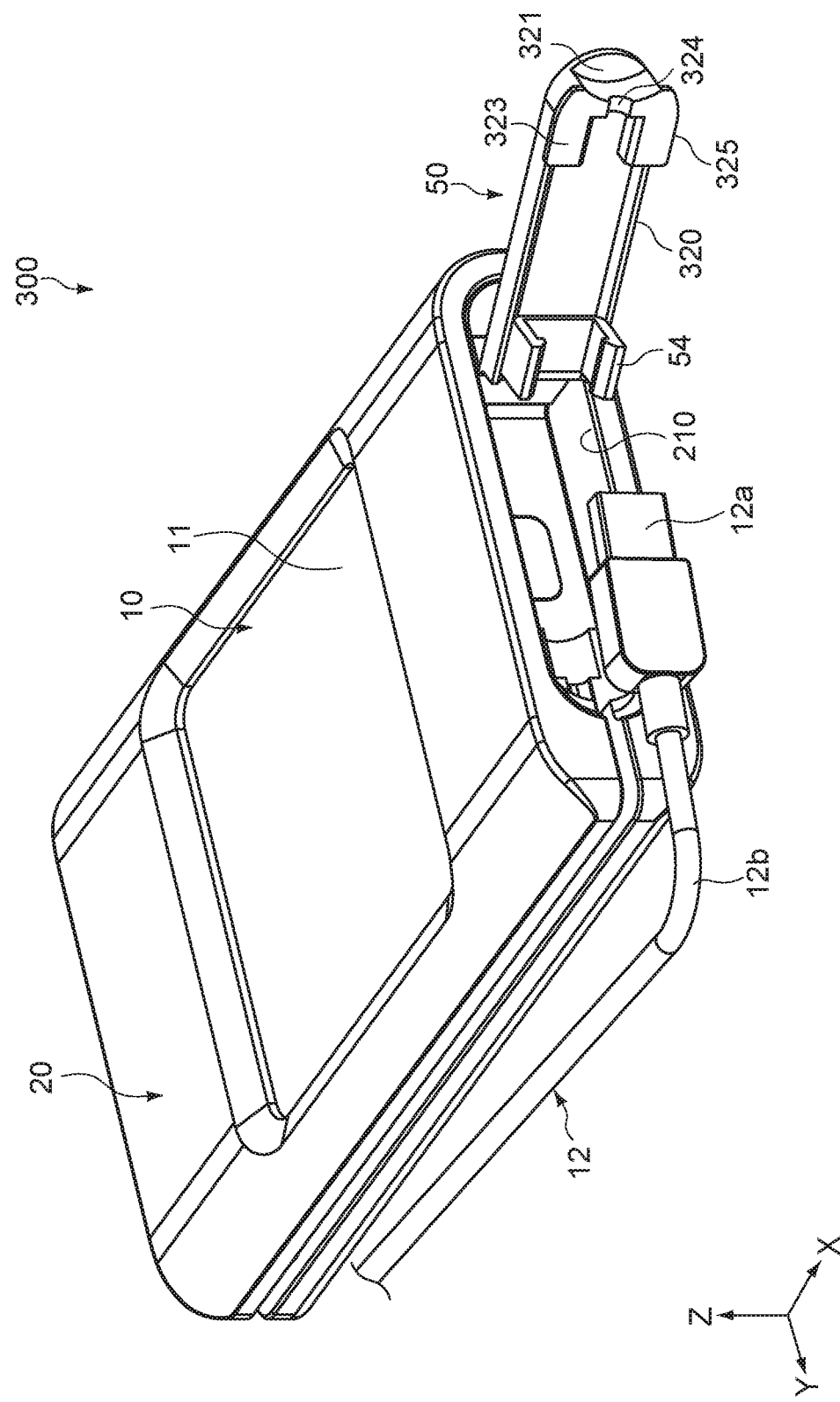
FIG. 14 is a perspective view of core parts of an electronic apparatus according to a third embodiment of the present technology in a state in which a connection cable is pulled out.
Figure 15:
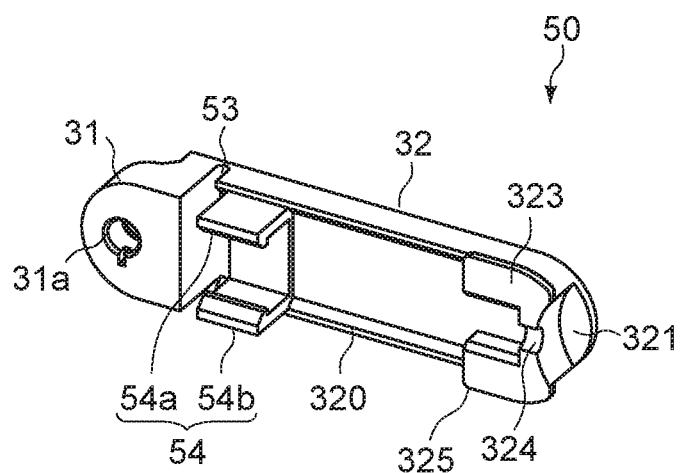
FIG. 15 is a perspective view of a terminal cover of the electronic apparatus.
Figure 16:
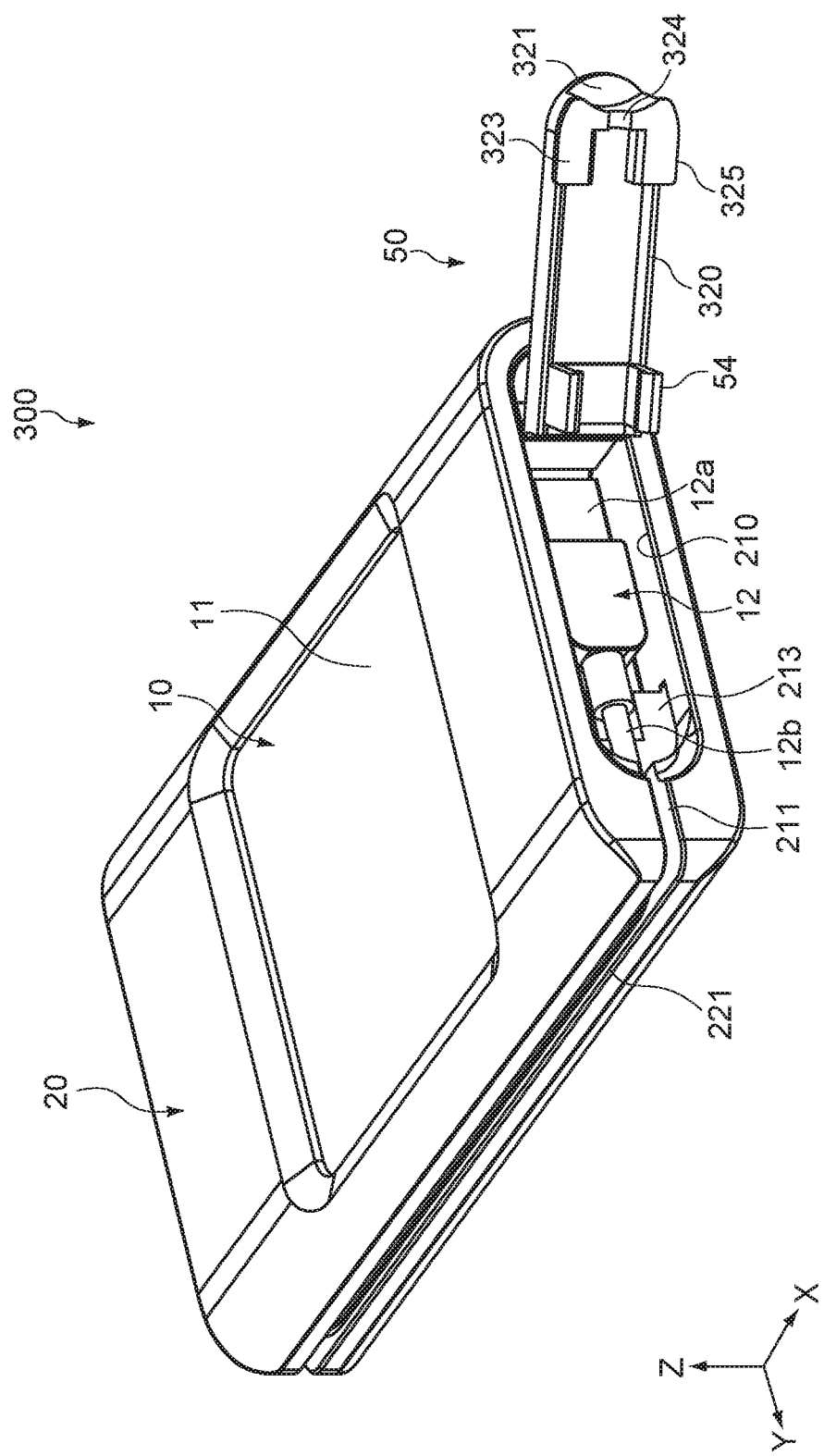
FIG. 16 is a perspective view of core parts of the electronic apparatus for describing how to store the connection cable.
Figure 17:
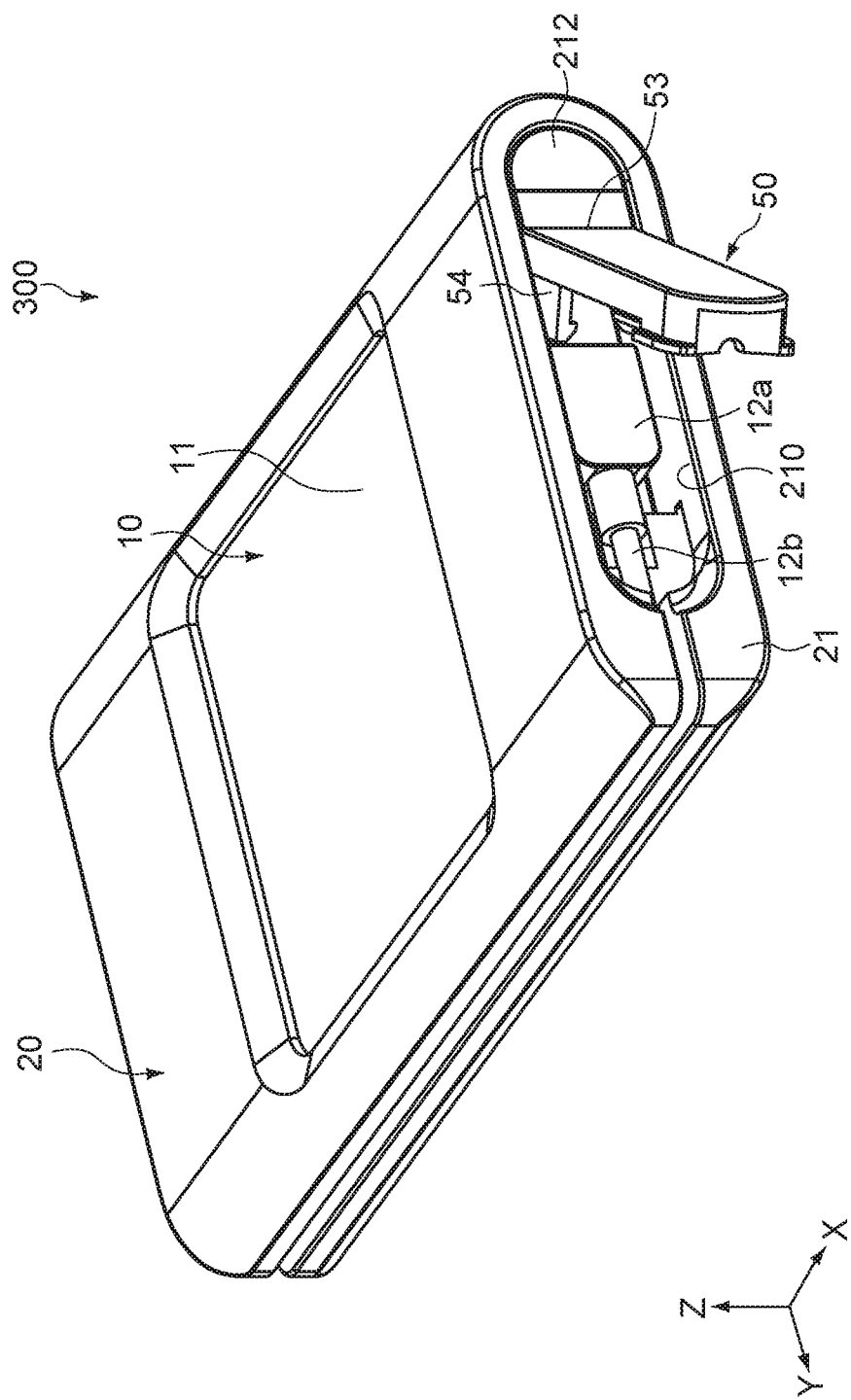
FIG. 17 is a perspective view of core parts of the electronic apparatus for describing how to store the connection cable.
Figure 18:
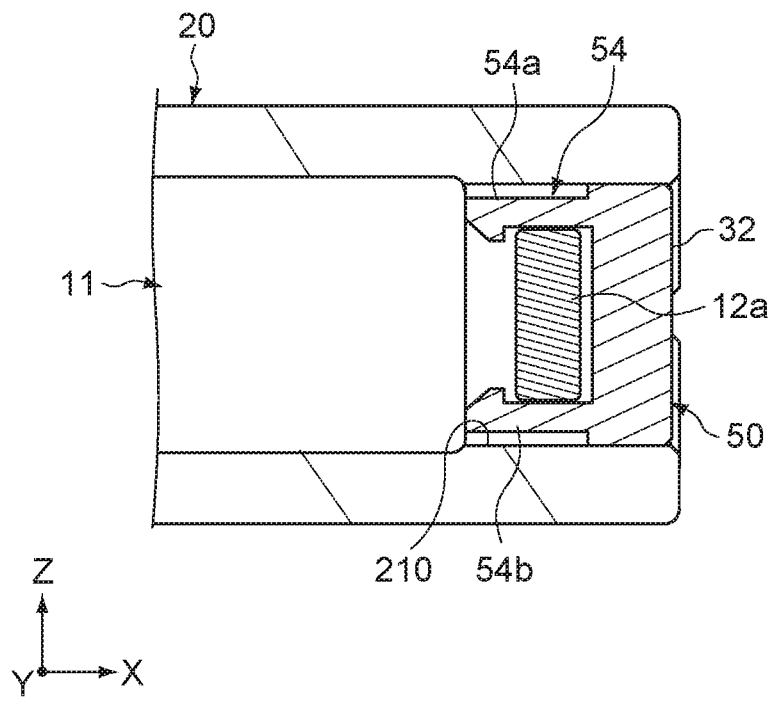
FIG. 18 is a perspective view of core parts of the electronic apparatus for describing how to store the connection cable.
Figure 19:
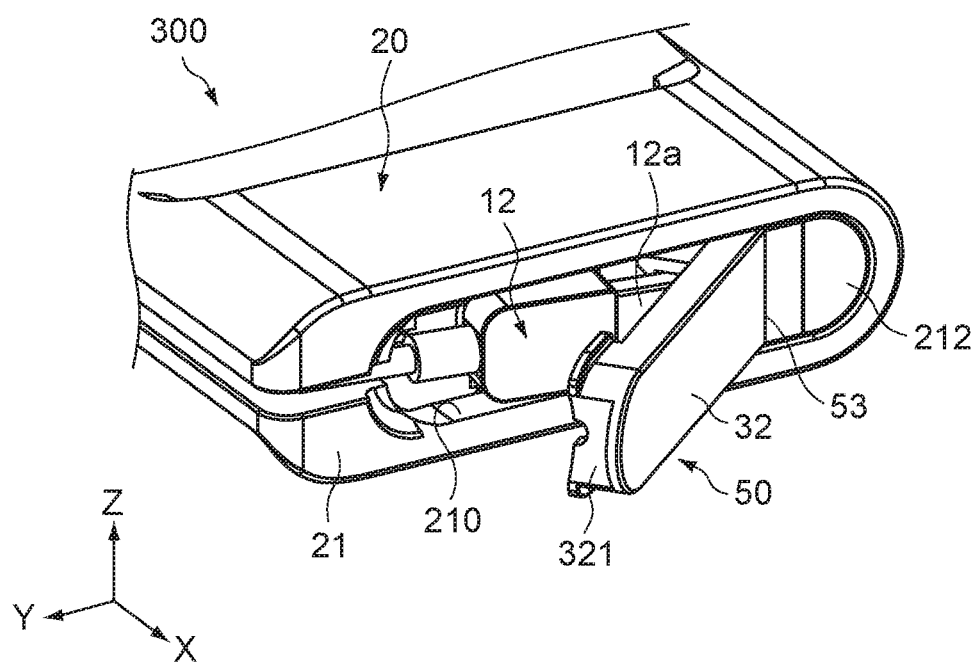
FIG. 19 is a cross-sectional view of core parts of the electronic apparatus for describing a relation between the connection cable and the terminal cover.

FIG. 14 to FIG. 19 illustrates a third embodiment of the present technology. FIG. 14 is a perspective view of core parts of an electronic apparatus in a state in which a terminal cover is open and a connection cable is pulled out. FIG. 15 is a perspective view of the terminal cover. FIG. 16 to FIG. 18 are perspective views of core parts of the electronic apparatus for describing now to store the connection cable. FIG. 19 is a cross-sectional view of core parts of the electronic apparatus for describing a relation between the connection cable and the terminal cover.

Hereinafter, structures different from those in the first embodiment will be mainly described. The structures that are similar to those in the first embodiment will be denoted by the same reference signs as the first embodiment, and description thereof will be omitted or simplified.

An electronic apparatus 300 according to this embodiment includes the apparatus main body 10, the cover main body 20, and a terminal cover 50 that is differently configured from the first embodiment.

In other words, the terminal cover 50 of this embodiment is similar to the first embodiment in that the terminal cover 50 includes the fixing part 31 and the flap part 32, the operation part. 321, the opposing surface 323, the first engagement groove 324, and the engagement protrusion 325 are provided on the peripheral wall part. 320 of the flap part 32. However, the terminal cover 50 is different from the first embodiment in that the terminal cover 50 includes a sandwich part 54 instead of the storage part 34, and the hinge 53 is a single hinge part provided between the fixing part 31 and the sandwich part 54.

The sandwich part 51 is provided between the operation part 321 and the hinge 53. In this embodiment, the sandwich part 54 is provided at an end part of the flap part 32 near the fixing part 31 side. The sandwich part 54 includes a pair of claws 54a and 54b that are opposed to each other in the Z direction. The claw parts 54a and 54b include hook parts (barbs) that protrude in directions opposed to each other. The claw parts 54a and 54b are elastically deformable in directions that gets close to each other and directions that separate from each other. Through the operation of pivotally moving the opening part 210 to the closure position, the claw parts 54a and 54b sandwich the tip of the terminal part 12a of the connection cable 12 stored in the opening part 210 (see FIG. 17 and FIG. 18). Since the sandwich part 54 includes an elastic material, it is possible to sandwich the tip of the terminal part 12a with appropriate elastomeric force.

The electronic apparatus 200 configured as described above according to this embodiment can achieve the working effects similar to the first embodiment described above. In the third embodiment, it is possible to open the opening part 210 with a large opening area through a single action when performing the operation of opening the terminal cover 40. Therefore, it is possible to ensure a good pullout property of the terminal part 12a of the connection cable 12 from the opening part 210, and a good storage property in the opening part 210.

In particular, since the terminal cover 50 according to this embodiment includes the sandwich part 54, the tip of the terminal part 12a sandwiched by the sandwich part 54 is pulled out toward the outside when the operation of opening the terminal cover 50 is performed. This makes it possible to enhance the pullout property of the terminal part 12a from the opening part 210 (see FIG. 19).

<Modification>

Although the embodiments of the present technology have been described above, the present technology is not limited to the above-described embodiments. Of course, various modifications are possible.

For example, in the above embodiments, the drive unit has been described as an example of the apparatus main body 10. Of course, the apparatus main body 10 is not limited thereto. The present technology is applicable to other apparatuses including connection cables such as a mobile phone terminal like a smartphone, an optical disc apparatus including the drive unit like an optical disc or a magneto-optical disk therein, and the like.

In a similar way, in the above embodiments, the protective cover for the drive unit has been described as an example. However, the protective cover is not limited thereto. The protective cover may be configured as a protective cover for the above-described other apparatuses.

In addition, in the above embodiments, the terminal cover is fixed to the periphery surface part on the short edge side of the apparatus main body. However, the terminal cover is not limited thereto. The terminal cover may be provided on a periphery surface part on the long edge side. In addition, the cable length of the connection cable 12 may be a length corresponding to the total length of the periphery surface part of the apparatus main body.

Note that, the present technology may also be configured as below.

(1) An electronic apparatus including:

an apparatus main body including a connection cable that includes a terminal part on its tip;

a cover main body including an opening part that is capable of storing the terminal part, the cover main body being affixed to the apparatus main body; and a terminal cover including a fixing part that is fixed to the apparatus main body, the terminal cover being mounted on the cover main body in a manner that the opening part is operable and closable.

(2) The electronic apparatus according to (1), in which the apparatus main body is a cuboid including a periphery surface part that includes short edge parts and long edge parts, and the terminal cover is fixed to a portion of the periphery surface part.

(3) The electronic apparatus according to (2), in which the cover main body includes a first cover part that covers a short edge part of the periphery surface part, and a second cover part that covers a long edge part of the periphery surface part, the opening part is made in the first cover part, and the second cover part includes a groove part that communicates with the opening part and that is capable of storing the connection cable.

(4) The electronic apparatus according to (3), in which the terminal cover includes an engagement protrusion that is engageable with an inner surface of a periphery part of the opening part, an opposing surface that is opposed to an inside of the opening part, and a first engagement groove that is formed on the opposing surface and that is engageable with the connection cable, and the opening part includes an abutment surface that capable of abutting on the opposing surface, and a second engagement groove that is formed on the abutment surface and that communicates with the groove part.

(5) The electronic apparatus according to any one of (1) to (4), in which the terminal cover includes a first end part that is fixed to the electronic apparatus, a second end part that is opposite to the first end part, and a first hinge part that is provided between the first end part and the second end part.

(6) The electronic apparatus according to (5), in which the terminal cover further includes a storage part that is provided between the first end part and the first hinge part and that is capable of storing the terminal part.

(7) The electronic apparatus according to (5) or (6), in which the terminal cover further includes a second hinge part that is provided between the first terminal part and the first hinge part and that has larger open torque than open torque of the first hinge part.

(8) The electronic apparatus according to any one of (5) to (7), in which the terminal cover further includes a sandwich part that is provided between the second terminal part and the first hinge part and that is capable of sandwiching the terminal part.

(9) The electronic apparatus according to any one of (1) to (8),
in which the cover main body and the terminal cover include an elastic material.

(10) The electronic apparatus according to (9),
in which the cover main body and the terminal cover include a same elastic material.

(11) A protective cover including:
a cover main body that is affixed to an apparatus main body and that includes an opening part capable of storing a terminal part of a connection cable fixed to the apparatus main body; and
a terminal cover including a fixing part that is fixed to the apparatus main body, the terminal cover being mounted on the cover main body in a manner that the opening part is openable and closable.

REFERENCE SIGNS LIST 10 apparatus main body
11 drive unit
12 connection cable
12a terminal part
20 cover main body
21 first cover part
22 second cover part
30, 40, 50 terminal cover
31 fixing part
32 flap part
33, 43, 53 hinge
34 storage part
54 sandwich part
100, 200, 300 electronic apparatus
210 opening part
211, 221 groove part
213 abutment surface
214, 324 engagement groove
215 engagement recessed part
320 peripheral wall part
321 operation part
323 opposing surface
325 engagement protrusion
331 first hinge part
332 second hinge part

What is claimed is:

1. An electronic apparatus, comprising
an apparatus main body including a connection cable, wherein a terminal part is included on a tip of the connection cable;
a cover main body including an opening part that is capable of storing the terminal part, the cover main body being affixed to the apparatus main body; and
a terminal cover including a fixing part that is fixed to the apparatus main body, the terminal cover being mounted on the cover main body in a manner that the opening part is openable and closable,
wherein the apparatus main body is a cuboid including a periphery surface part that includes short edge parts and long edge parts,
wherein the terminal cover is fixed to a portion of the periphery surface part,
wherein the cover main body includes a first cover part that covers a short edge part of the periphery surface part, and a second cover part that covers a long edge part of the periphery surface part,
wherein the opening part is made in the first cover part, and
wherein the second cover part includes a groove part that communicates with the opening part and that is capable of storing the connection cable.

2. The electronic apparatus according to claim 1, wherein the terminal cover includes an engagement protrusion that is engageable with an inner surface of a periphery part of the opening part, an opposing surface that is opposed to an inside of the opening part, and a first engagement groove that is formed on the opposing surface and that is engageable with the connection cable, and
the opening part includes an abutment surface that is capable of abutting on the opposing surface, and a second engagement groove that is formed on the abutment surface and that communicates with the groove part.

3. The electronic apparatus according to claim 2,
wherein the terminal cover includes a first end part that is fixed to the electronic apparatus, a second end part that is opposite to the first end part, and a first hinge part that is provided between the first end part and the second end part.

4. The electronic apparatus according to claim 1,
wherein the terminal cover includes a first end part that is fixed to the electronic apparatus, a second end part that is opposite to the first end part, and a first hinge part that is provided between the first end part and the second end part.

5. The electronic apparatus according to claim 4,
wherein the terminal cover further includes a sandwich part that is provided between the terminal part and the first hinge part and that is capable of sandwiching the terminal part.

6. The electronic apparatus according to claim 4, wherein the terminal cover further includes a storage part that is provided between the first end part and the first hinge part and that is capable of storing the terminal part.

7. The electronic apparatus according to claim 4, wherein the terminal cover further includes a second hinge part that is provided between the terminal part and the first hinge part and that has larger open torque than open torque of the first hinge part.

8. The electronic apparatus according to claim 1, wherein the cover main body and the terminal cover include an elastic material.

9. The electronic apparatus according to claim 8, wherein the cover main body and the terminal cover include a same elastic material.

10. An electronic apparatus, comprising:
an apparatus main body including a connection cable, wherein a terminal part is included on a tip of the connection cable;
a cover main body including an opening part that is capable of storing the terminal part, the cover main body being affixed to the apparatus main body; and
a terminal cover including a fixing part that is fixed to the apparatus main body, the terminal cover being mounted on the cover main body in a manner that the opening part is openable and closable,
wherein the terminal cover includes a first end part that is fixed to the electronic apparatus, a second end part that is opposite to the first end part, and a first hinge part that is provided between the first end part and the second end part, and wherein the terminal cover further includes a storage part that is provided between the first end part and the first hinge part and that is capable of storing the terminal part.

11. The electronic apparatus according to claim 10, wherein
the apparatus main body is a cuboid including a periphery surface part that includes short edge parts and long edge parts, and
the terminal cover is fixed to a portion of the periphery surface part.

12. The electronic apparatus according to claim 10, wherein the terminal cover further includes a second hinge part that is provided between the terminal part and the first hinge part and that has larger open torque than open torque of the first hinge part.

13. The electronic apparatus according to claim 10, wherein the terminal cover further includes a sandwich part that is provided between the terminal part and the first hinge part and that is capable of sandwiching the terminal part.

14. The electronic apparatus according to claim 10, wherein the cover main body and the terminal cover include an elastic material.

15. The electronic apparatus according to claim 14, wherein the cover main body and the terminal cover include a same elastic material.

16. An electronic apparatus, comprising:
an apparatus main body including a connection cable, wherein a terminal part is included on a tip of the connection cable;
a cover main body including an opening part that is capable of storing the terminal part, the cover main body being affixed to the apparatus main body; and
a terminal cover including a fixing part that is fixed to the apparatus main body, the terminal cover being mounted on the cover main body in a manner that the opening part is openable and closable,
wherein the terminal cover includes a first end part that is fixed to the electronic apparatus, a second end part that is opposite to the first end part, and a first hinge part that is provided between the first end part and the second end part, and
wherein the terminal cover further includes a second hinge part that is provided between the terminal part and the first hinge part and that has larger open torque than open torque of the first hinge part.

17. The electronic apparatus according to claim 16, wherein the terminal cover further includes a sandwich part that is provided between the terminal part and the first hinge part and that is capable of sandwiching the terminal part.

18. The electronic apparatus according to claim 16, wherein the cover main body and the terminal cover include an elastic material.

19. The electronic apparatus according to claim 18, wherein the cover main body and the terminal cover include a same elastic material.

20. The electronic apparatus according to claim 16, wherein
the apparatus main body is a cuboid including a periphery surface part that includes short edge parts and long edge parts, and
the terminal cover is fixed to a portion of the periphery surface part.

* * * * *